United States Patent [19]

Altman

[11] 3,963,338

[45] June 15, 1976

[54] LOW PROFILE EPISCOPIC PROJECTOR AND OPAQUE MATERIALS THEREFOR

[76] Inventor: Gerald Altman, 41 Westminster Road, Newton Centre, Mass. 02159

[22] Filed: Sept. 19, 1974

[21] Appl. No.: 507,478

Related U.S. Application Data

[63] Continuation-in-part of Ser. No. 329,574, Feb. 5, 1973, Pat. No. 3,837,739, which is a continuation-in-part of Ser. No. 81,987, Oct. 19, 1970, Pat. No. 3,778,142.

[52] U.S. Cl. ........................... 353/120; 156/4; 156/22; 350/288
[51] Int. Cl.² ........... G03B 21/00; G02B 5/08; C23F 1/00
[58] Field of Search ........... 353/44, 45, 120; 350/288; 117/8, 35 V; 156/3, 4, 7, 22; 161/4, 5, 22

[56] References Cited
UNITED STATES PATENTS
2,776,598 1/1957 Dreyer ........................... 350/288

Primary Examiner—Samuel B. Rothberg
Assistant Examiner—Steven L. Stephan
Attorney, Agent, or Firm—Morse, Altman, Oates & Bello

[57] ABSTRACT

A large copy projector, in which the presence of elevated optics in front of the screen is avoided, uses opaque sheeting that is adapted to receive related graphic matter on its upper and lower faces. Simultaneously, the upper face is unobstructedly available for direct observation and manual access, and the lower face is unobtrusively available for image projection through a folded optical path below the opaque sheeting and a projection lens positioned elsewhere than directly over the copy. The copy is characterized by a lower specularly reflecting face that is accessible to the optical system from below but that can be marked from above by chemical etching from a user's pen or the like.

11 Claims, 12 Drawing Figures

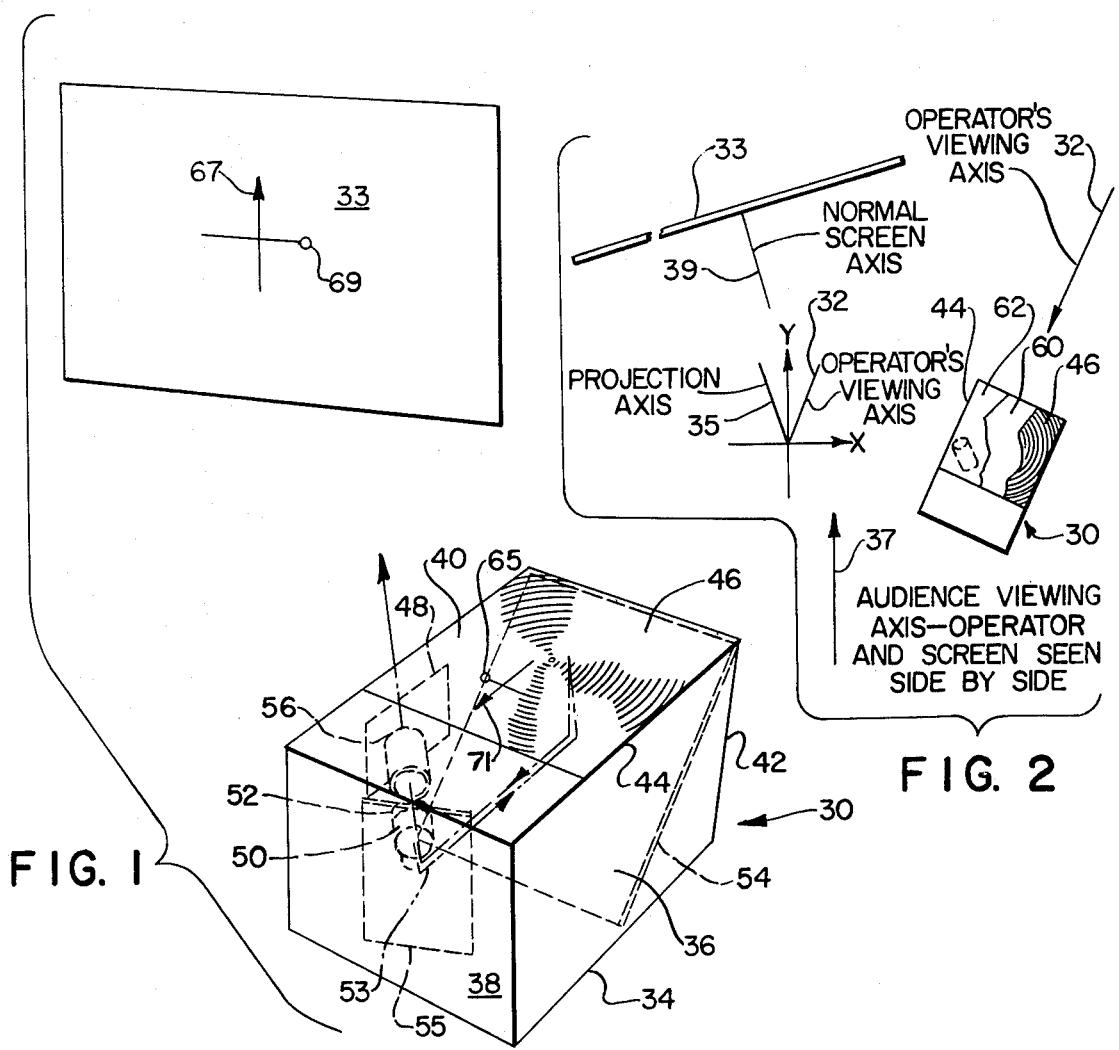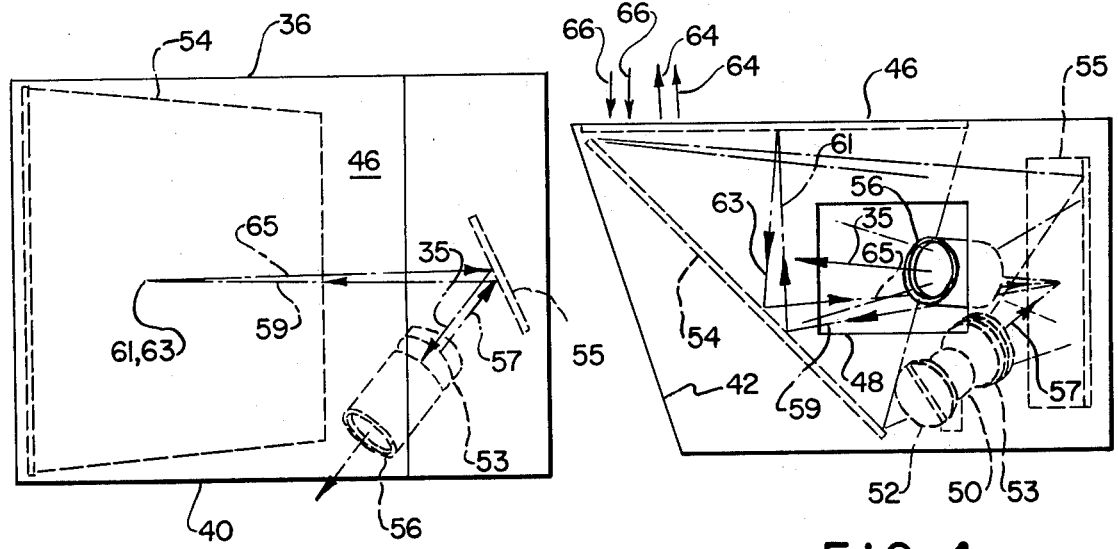

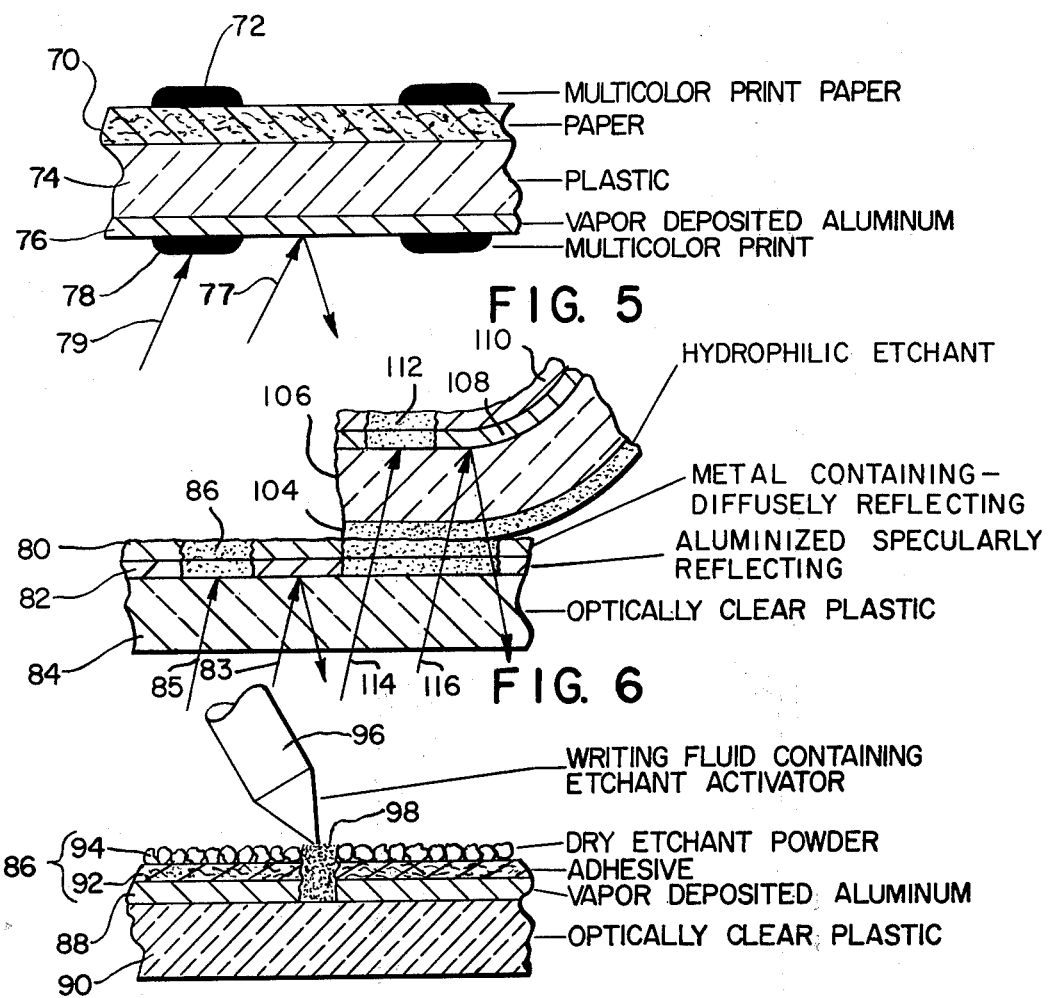
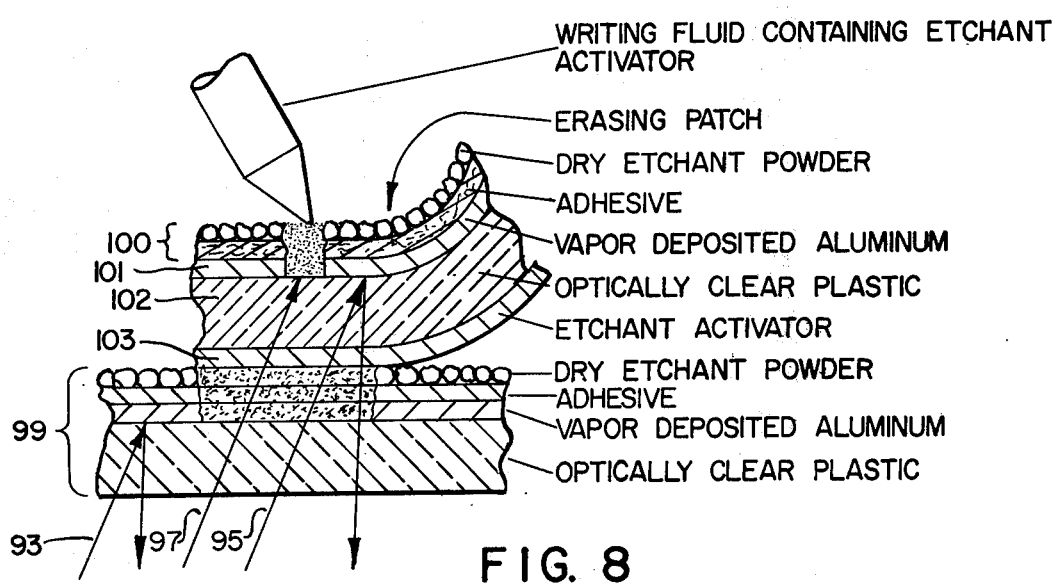

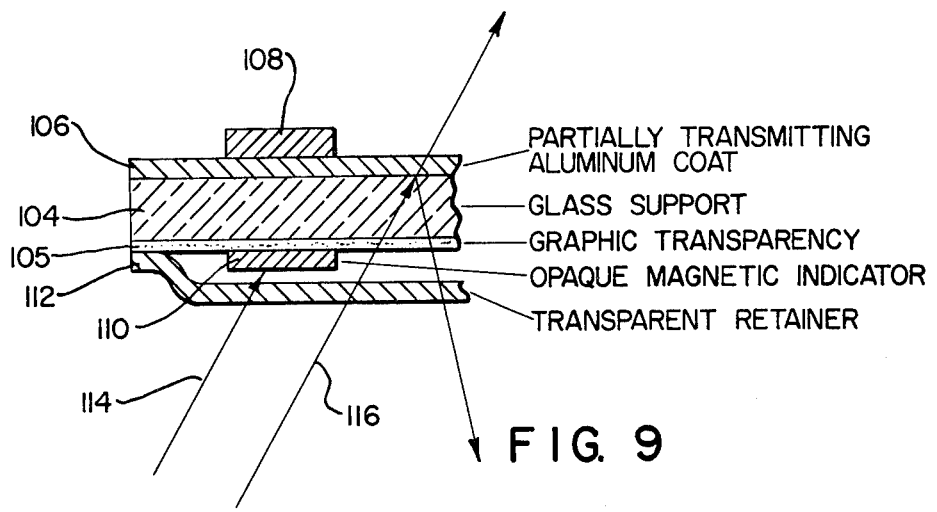
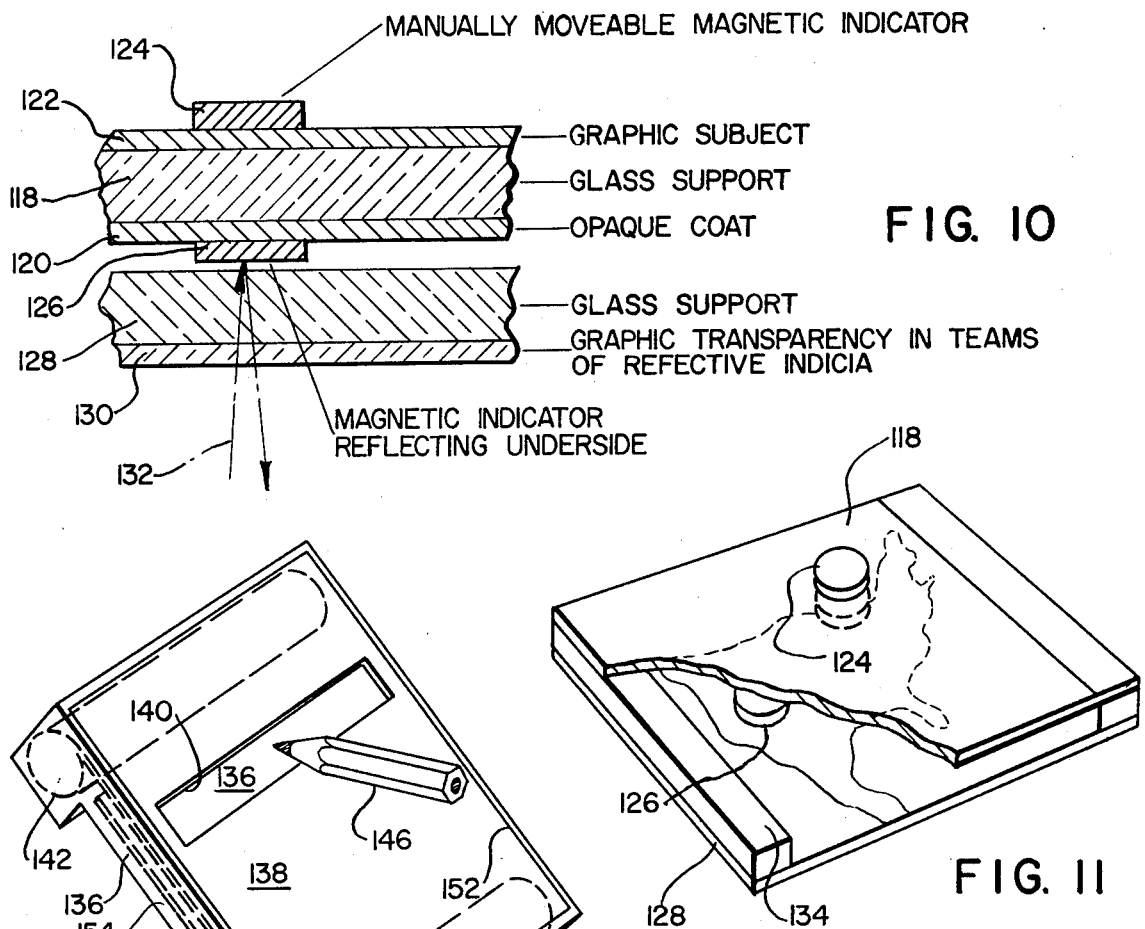

LOW PROFILE EPISCOPIC PROJECTOR AND OPAQUE MATERIALS THEREFOR

RELATED APPLICATION

The present application is a continuation-in-part of application Ser. No. 329,574, filed Feb. 5, 1973, now U.S. Pat. No. 3,837,739, issued Sept. 24, 1974, which, in turn, is a continuation-in-part of application Ser. No. 81,987, filed Oct. 19, 1970, now U.S. Pat. No. 3,778,142, issued Dec. 11, 1973.

BACKGROUND AND SUMMARY

The present invention relates to optical imaging and, more particularly, to systems, processes and products involving episcopic imaging, i.e. imaging utilizing light generally reflected from or at a copy sheet or other visual subject, as distinguished frm diascopic imaging, i.e. imaging utilizing light generally directed through a copy sheet. The present invention is directed primarily to large copy projectors, exemplified by so-called "overhead" and "opaque" projectors. Diascopic overhead projectors have been characterized by: bulky hardware that obtrudes between the audience and the projected image and causes the operator to assume an unnatural posture in order not to obtrude between the projection lens and the screen; and transparencies that are uncomfortable for the operator to view, handle and store. Episcopic overhead projectors theoretically are more compact than diascopic overhead projectors because illuminating source and imaging lens are at the same side of the copy sheet, whereby vertical dimensions are reduced. But, in practice, episcopic overhead projectors also have been obtrusive because either (1) the light source and imaging lens are positioned by a post in a sizeable casing above the copy sheet or (2) a bulky housing envelops the light paths to and from the copy sheet in order to control glare. Episcopic copy, when composed of paper or sheeting of equivalent appearance, has not been adapted for brilliant imaging because of its optical diffusivity.

The primary objects of the present invention are the provision of systems, processes and products involving a portable projector and a copy sheet assemblage that are particularly interrelated to achieve, during projection, direct visual and manual access to the copy sheet by the operator, absolute shielding of the operator and the audience from illuminating light, no interposition of the optical projection system above the level of the copy sheet between the audience and the screen, and natural posture of the operator at the projector. The optical projector comprises a low profile housing in which are positioned an upper window for supporting the copy sheet with its front face upward for direct viewing, a source of illuminating light from which the exterior of the housing is absolutely shielded by the copy sheet itself, and a folded optical path below the window to an imaging lens at the side of the projector. The arrangement is such that an unusually powerful illuminating lamp is practicable. The copy sheet is characterized by a laminated sequence of strata including an upper diffusely reflecting stratum, an intermediate specularly reflecting stratum and a lower self-supporting optically clear polymeric stratum. The specularly reflecting stratum can be marked by applying to the diffusely reflecting stratum a pen containing a chemical reactant that permeates through the diffusely reflecting stratum and changes the optical character of the specularly reflecting stratum. Thus the copy sheet is capable of registering markings that are produced from above but are accessible to the optical system from below. Corrections can be made by a chemical etching patch which can clear sections of the diffusely reflecting and specularly reflecting strata by virtue of a lower optically clear adhesive stratum containing a chemical reactant and present a fresh upper specularly reflective stratum for marking and projection.

Other objects of the present invention will in part be obvious and will in part appear hereinafter.

The invention accordingly comprises the systems, processes and products, together with their components, steps, parts and interrelationships, which are exemplified by the present disclosure, the scope of which will be indicated in the appended claims.

BRIEF DESCRIPTION OF DRAWINGS

For a fuller understanding of the nature and objects of the present invention, reference is made to the following detailed description, taken in connection with the accompanying drawings, wherein:

FIG. 1 is a perspective view in use of a large copy projector system embodying the present invention;

FIG. 2 is a top plan view of the system of FIG. 1, illustrating an exchange of copy sheets in accordance with the present invention;

FIG. 3 is a top plan view of the projector of FIGS. 1 and 2.

FIG. 4 is a side elevation of the projector of FIG. 3;

FIG. 5 is an exaggerated cross sectional view of a copy sheet embodying the present invention;

FIG. 6 is an exaggerated, cross-sectional view of another product embodying the present invention;

FIG. 7 is an exaggerated, cross-sectional view of another product embodying the present invention;

FIG. 8 is an exaggerated cross-sectional view of another product embodying the present invention;

FIG. 9 is an exaggerated cross-sectional view of another product useful in the projectors of the present invention;

FIG. 10 is an exaggerated cross-sectional view of another product useful in the projectors of the present invention;

FIG. 11 is an exaggerated perspective view of the product of FIG. 10; and

FIG. 12 is a perspective view of another product embodying the present invention.

DETAILED DESCRIPTION

A large copy projector embodying the present invention, i.e. for copy greater than 6 × 6 inches in area, is shown in FIG. 1 as including a housing 30, which mounts and contains the operating optical components. As shown, housing 30 is in the form of a sheet metal enclosure having a flat base panel 34, a flat side panel 36, a flat front panel 38, a flat side panel 40, and a rear panel 42. Panel 34 is generally horizontal, panels 36, 38, and 40 are generally vertical, and panel 42 is generally oblique, extending from base panel 34 upwardly and outwardly to the top of the housing. At the top of the housing is a periphery 44 which encompasses an optically clear, generally horizontal, glass or plastic window 46, the upper face of which is flat and the lower face of which has a Fresnel lens configuration. Side panel 40 has a projection window 48. As shown in FIG. 2, side panels 36, 40 are disposed substantially along an operator's viewing axis 32 and projection to a screen 33 occurs along a projection axis 35. It will be observed that, assuming an audience viewing axis at 37, screen 33 and projector 30 are viewed by an audience side-by-side. With respect to an X,Y coordinate system, operator's viewing axis 32 in the first quadrant intersects the Y axis at less than 45°, projection axis 35 in the second quadrant intersects the Y axis at less than 45°, and screen 33 is normal to some axis 39, in the third quadrant, that intersects the Y axis at less than 45° and that may or may not be coincident with projection axis 35.

The optical components include: an illuminating lamp 50, associated with a reflecting spherical mirror 52 and a heat absorbing condensing lens 53, disposed along an illuminating axis in a plane that includes projection axis 35; a rearward plane mirror 54 generally underlying Fresnel lens 46 along a plane obliquely intersecting the axis of the Fresnel lens; a forward plane mirror 55 generally forward of Fresnel lens 46 in a plane that is parallel to the axis of the Fresnel lens and oblique with respect to operator's viewing axis 32 and projection axis 35; and a projection lens 56 that defines and is disposed along projection axis 35. As shown in FIGS. 3 and 4, light is directed from lamp 50 along an illuminating axis segment 57 to mirror 55, is deflected along an illuminating axis segment 59 to rear mirror 54, is deflected along an illuminating axis segment 61 and through Fresnel lens 46 to a specularly reflective copy sheet thereon; and imaging light is returned from the copy sheet through the Fresnel lens along an imaging axis segment 63 to rear mirror 54, is deflected along an imaging axis segment 65 to front mirror 55, and is deflected through lens 56 along projection axis 35. It will be observed that the illuminating light diverges, that the imaging light converges and that the paths of the illuminating and imaging light overlap at mirror 55.

As shown at 60 in FIG. 2, an opaque copy sheet, when superposed on Fresnel lens 46, presents an upper face for direct observation and a lower face for imaging by lens 56. As suggested by arrows 64, 64 and 66, 66, light rays emerging upwardly through Fresnel lens 46 are substantially parallel or collimated and light rays returned by the reflecting under face of copy sheet 60 are substantially parallel or collimated. A suitable vent and fan arrangement draws air through the housing in order to maintain the correct temperature at the Fresnel lens and at the illuminating lamp. Replacing an initial copy sheet 60 by a new copy sheet 62 merely involves superposing copy sheet 62 upon copy sheet 60 and, while copy sheet 62 is held in place above window 46, withdrawing copy sheet 60 from between copy sheet 62 and Fresnel lens 46. It will be appreciated that, projector 30 is capable of projecting transparencies which are interposed between Fresnel lens 46 and a plane cover mirror that can be superposed thereon. In one form (not shown) this cover mirror is hinged to housing 30. From the operator's viewing position, the upward and rightward directions of the copy are indicated at 71, 65. These directions correspond to the upper and rightward directions of the screen indicated at 67, 69.

An integrated copy sheet of a type particularly adapted for use with the projector of FIG. 1 is shown in FIG. 5. This copy sheet comprises an upper print receiving stratum 70 which carries an outer visual medium 72 and an inner support stratum 74 which is coated with a reflecting stratum 76 and carries a visual medium 78. In one form, print receiving stratum 70 is composed of a porous material such as paper, visual medium 72 is an ink containing a pigment such as carbon in an organic vehicle, support stratum 74 is composed of a dimensionally stable polymer such as polyester ranging in thickness from 3 to 15 mils, reflecting stratum 76 is composed of aluminum or silver that has been vacuum vapor deposited in a thickness ranging from 500 to 2500 Angstrom units, and visual medium 78 is an ink containing a pigment such as carbon in an organic vehicle. In a specified example of the product of FIG. 5, the dimensions are approximately as follows: porous paper stratum 70 is 0.001 inch thick; polymeric support stratum 76 is 10 mils thick; and vapor deposited aluminum stratum is 1200 Angstrom units thick.

The arrangement is such that visual medium 72 may be viewed directly in terms of diffusely reflected light that is ambient to projector 30 and visual image 78 may be projection imaged on a screen in terms of specularly reflected light to which it is subjected through Fresnel lens 46 from within the housing of projector 30. Thus upwardly incident rays 77 are differentially specularly reflected and upwardly incident rays 79 are differentially specularly absorbed. Since these images are in mirror reversed correspondence, the operator and the audience see the same image at any time.

The graphic product of FIG. 6 is capable of being manually marked to produce, simultaneously, a visual record for direct observation from the front and for optical projection from the rear in conjunction with the projector of FIG. 1. This product, in laminated sequence, comprises: a visual image receiving, diffusely reflecting stratum 80; a visual image, specularly reflecting stratum 82; and an optically clear, transparent, polymeric support stratum 84. Each of strata 80, 82 ranges in thickness from 500 to 2500 Angstrom units; and stratum 84 ranges in thickness from 3 to 15 mils. In a preferred form, stratum 80 is composed of a metal or metal compound and is in direct contact with stratum 82. It has been found that a special ink 86, which may be applied from a fibrous pen, is capable of penetrating through strata 80 and 82 to leave an etched mark through both strata. As above in connection with FIG. 5, upwardly incident rays 83 are differentially reflected and upwardly incident rays 85 are differentially absorbed. In association with the sheet is an erasing patch comprising, in laminated sequence, a diffusely reflecting stratum 110, a specularly reflecting stratum 108, an optically clear transparent, polymeric support stratum 106, and an optically clear pressure sensitive stratum 104, containing an etchant composition. The etchant activator serves to clear the region of strata 80,82 with which it comes in contact. The patch itself then may be marked at 112 so as to absorb rays 114 and to reflect rays 116. The dimensions of the patch and the dimensions of the sheet correspond.

In the product illustrated in FIG. 6, strata 80 and 110, which are directly chemically bonded to aluminum strata 82 and 108, respectively, are in the form of a metal containing deposit that has been produced either by chemical reaction with aluminum strata 82 and 108, by chemical or electrochemical plating, or by chemical vapor deposition or vacuum vapor deposition. For example, in one form, strata 80 and 110 are composed of diffusely reflecting zinc which has been deposited, at room temperature, from an alkaline aqueous, solution of zinc oxide. In another form, strata 80 and 110 are composed of diffusely reflecting tin which has been deposited, at room temperature, from an alkaline aqueous solution of sodium or potassium stannate.

Preferably, ink 86 contains (1) a polar solute such as water or methyl alcohol, (2) a pigment for example a dye, and (3) a soluble salt of a metal that is lower in the electromotive series than the metals of strata 80,82 and 108,110, i.e. is characterized by a readiness to acquire electrons from these metals so as to be reduced in a reaction by which these metals are substituted in the salt. Thus with respect to aluminum, such etchant metals include maganese, zinc, chromium, iron, cadmium, cobalt, nickel, tin, lead, copper, bismuth, antimony, mercury, silver, platinum and gold. For example, when strata 80, 110 are composed of zinc or tin and strata 82, 108 are composed of aluminum, the salt typically is a halide, for example, cupric chloride. In another form, ink 86 contains, in aqueous dispersion, a black pigment composed for example of carbon or iron oxide and a polar reagent, for example, a base such as sodium hydroxide or ammonium hydroxide or an acid such as hydrochloric acid. In one modification, image receptive stratum 80 is impregnated with a catalyst such as an alkali carbonate. Ink 86, in another form, contains a dye such as a diazo dye or ferric amonium oxalate, by which image receptive stratum 80 is marked from directed observation and aluminum reflecting stratum 82 is colored without etching to produce a specularly reflective colored mark for projection. When the erasing patch of FIG. 6 is used, preferably the dyes in etchant fluid 86, 112 are such as to be cleared by the etchant fluid of adhesive stratum 104. Otherwise the composition of etchant fluid 104 is analogous to that of etchant fluid 86, 112.

The graphic product of FIG. 7 is capable of being manually marked to produce, simultaneously, a visual record for direct observation from the front and for optical projection from the rear in conjunction with the projector of FIG. 1. This product, in laminated sequence, comprises a visual image receiving stratum 86, a specularly reflecting stratum 88, and an optically clear, transparent, polymeric support stratum 90. As shown, specularly reflective stratum is in the form of a vapor deposited aluminum coat on polymeric stratum 90 and visual image receiving stratum is in the form of a pressure sensitive adhesive coat 92 to which has been adhered a coat of reactive power 94. As shown, a manually held fabric or other marking pen 96 is capable of applying a writing fluid 98 that contains an etchant activator. When etchant activator 98 contacts etchant powder 94, incremental reaction with aluminum 88 occurs. The result is visual indicia that is accessible at the upper face of the copy to the eye of the operator and accessible at the lower face of the copy to the enclosed specular illuminating and projecting optics of projector 30 for observation on the screen by the audience.

In one form: (a) the etchant powder includes a soluble salt of a metal that is lower in the electromotive series than aluminum, i.e. a salt of manganese, zinc, chromium, iron, cadmium, cobalt, nickel, tin, lead, copper, bismuth, antimony, mercury, silver, platinum and gold; and (b) the activator ink simply is a regular commercial ink including an aqueous dispersion of a pigment such as iron oxide or carbon or a dye such as a diazo dye. The salt typically is a halide, for example, cupric chloride.

In an alternative embodiment of the product of FIG. 7, granules 94 are in the form of microcapsules which contain an etchant fluid of the type disclosed in connection with FIG. 6 and marker 96 is simply a pressure applying element capable of rupturing the capsules in order to release the etchant fluid.

FIG. 8 illustrates a graphic product 99 of the type shown in FIG. 7. In association with sheet 99 is an erasing patch comprising, in laminated sequence, a visual image receiving stratum 100, a specularly reflecting stratum 101, an optically clear transparent, polymeric support stratum 102, and an optically clear pressure sensitive stratum 103 containing an etchant activator of the type shown at 98 in FIG. 7. The etchant activator serves to clear the aluminized region of sheet 99 with which it comes in contact. The result is that certain upwardly incident rays 93 and 95 are differentially specularly reflected whereas others 97 are differentially absorbed.

FIG. 9 illustrates an accessory by which a manually controlled indicator can be positioned for observation by an operator at the projector and for observation by an audience on the screen. This accessory includes an upper sheet glass support 104 and a lower sheet plastic retainer 112, which is secured to and spaced from support 104 by an upwardly and outwardly projecting flange. Glass support 104 and plastic retainer 112, both, are optically clear and transparent. At the upper face of support 104 is a vapor deposited coat of aluminum, which is partially reflecting and partially transmitting, i.e. sufficiently thin, say less than 1,000 angstrom units thick, to enable observation from above of a graphic subject 105, which is adhered to the under face of support 104. A manually controlled slider 108 and follower 110 ride at the upper and lower faces of support 104, respectively. In one form, slider 108 is a permanent magnet and follower 110 is ferromagnetic element. By virtue of the magnetic coupling between elements 108 and 110, manual movement of element 108 causes analogous movement of follower 110 in such a way that positioning of element 108 with respect to graphic subject 105 is observable from above by the operator and positioning of element 110 with respect to graphic subject 105 is observable on the screen. It will be observed that illuminating ray 114 is absorbed by the opaque surface of element 110 but that illuminating ray 116, which is not intercepted by element 110 is partly transmitted and partly reflected by aluminum coat 106.

FIGS. 10 and 11 illustrate an alternative accessory by which a manually controlled indicator can be positioned for observation by an operator at the projector and for observation by an audience on the screen. This accessory includes an upper sheet glass support 118 and a lower sheet glass support 128, which are secured to each other in parallel relation by spacers 134. A graphic subject 122 is laminated to the upper face of support 118. An opaque stratum 120 is laminated to the lower face of support 118. Laminated to the lower face of support 128 is a graphic transparency 130, of which the graphic indicia are in the form of vapor deposited regions. A manually controlled indicator 124 and a magnetically controlled indicator 126 slide at the upper and lower faces of support 118, respectively. In one form, indicator 124 is a permanent magnet and indicator 126 is a ferromagnetic element with a specularly reflecting lower face. By virtue of the magnetic coupling between elements 124 and 126, manual movement of element 124 causes analogous movement of follower element 126 in such a way that positioning of element 124 with respect to graphic subject 122 is observable from above by the operator and positioning of element 126 with respect to graphic subject 130 is observable on the screen. It will be observed that illuminating rays 132 striking either reflecting element 126 or reflecting indicia on graphic subject 130 are projected onto the screen.

The product of FIG. 12 enables a transparency 136 on Fresnel lens 46 to be marked from above by a grease pencil 146 through a slot 140 in a specularly reflective sheet 138. The position of the slot is controlled by a pair of rolls 142, 144 and all regions of transparency 136 except for the region in registration with slot 140 are projected onto the screen. Rolls 142, 144 and sheet 138 are held by a suitable casette 150 that is open at its top 152 and bottom 154 to permit manual access from above and optical access from below and that rests on top of projector 30 with opening 154 in registration with Fresnel lens 46.

The present invention thus provides a variety of systems involving opaque projection, which ensure: simultaneous, direct optical and mechanical access to the subject by the operator; absolute shielding of the operator and the audience from illuminating light; no interposition of the optical system above the level of the subject between the audience and the screen; and natural posture of the operator at the projector. Since certain changes may be made in the foregoing disclosure, without departing from the scope of the invention hereof, it is intended that all matter described in the foregoing specification or shown in the accompanying drawings, be interpreted in an illustrative and not in a limiting sense.

What is claimed is:

1. A visual graphic sheet for receiving indicia for optical projection, said visual sheet comprising, in laminated sequence, an upper diffusely reflecting stratum, an intermediate specularly reflecting stratum, and a lower optically clear polymeric stratum, said specularly reflecting stratum being composed of vapor deposited aluminum ranging in thickness from 500 to 2500 Angstroms, said diffusely reflecting stratum being of such composition and thickness as to be permeable to an aqueous solution of a salt of a metal that is lower in the electromotive series than aluminum, said polymeric stratum being sufficiently thick to be self supporting, said visual sheet being no greater than 15 mils thick, said upper diffusely reflecting stratum and said intermediate specularly reflecting stratum being accessible from above for manual marking by differential application of said aqueous solution, said specularly reflecting stratum being accessible from below to illuminating light transmitted through said optically clear polymeric stratum.

2. A visual graphic tab for receiving indicia for optical projection and for erasing markings on a specularly reflective sheet for projection, said visual tab comprising, in laminated sequence, an upper diffusely reflecting stratum, an intermediate specularly reflecting stratum, an intermediate optically clear polymeric stratum, and a lower optically clear adhesive stratum, said specularly reflecting stratum being composed of vapor deposited aluminum ranging in thickness from 500 to 2500 Angstroms, said diffusely reflecting stratum being of such composition and thickness as to be permeable to an aqueous solution of a salt of a metal that is lower in the electromotive series than aluminum, said polymeric stratum being sufficiently thick to be self supporting, said adhesive stratum containing an aqueous solution of a salt of a metal that is lower in the electromotive series than aluminum, said visual sheet being no greater than 15 mils thick, said upper diffusely reflecting stratum and said intermediate specularly reflecting stratum being accessible from above for manual marking by differential application of said aqueous solution, said specularly reflecting stratum being accessible from below to illuminating light transmitted through said optically clear polymeric stratum.

3. A graphic product for optical projection, said graphic product comprising, as laminated strata:
   a. a support stratum composed of an optically clear polymer;
   b. an intermediate visual stratum containing a layerwise distribution of specularly reflecting highlight regions and contrasting non-specularly reflecting shadow regions;
   c. a backing stratum characterized by a surface housing diffuse reflection properties;
   d. Said visual stratum being charactorized by vapor deposited metal in said highlight regions and by the result of a chemical reaction between vapor deposited metal and a chemical reagent in said shadow regions;
   e. said visual stratum constituting means for receiving illuminating light through said support stratum from a lamp and for differentially reflecting light through said support stratum to an optical objective.

4. The graphic product of claim 3 wherein said vapor deposited metal is aluminum.

5. The graphic product of claim 4 wherein said aluminum ranges in thickness from 500 to 2500 Angstroms.

6. The graphic product of claim 3 wherein the overall thickness of said product ranges up to 15 mils.

7. The graphic product of claim 3 wherein said reaction product contains said chemical reagent is said vapor deposited metal and a component of an aqueous solution of a salt of a metal that is lower in the electromotive series than said vapor deposited metal.

8. The graphic product of claim 3 wherein said backing stratum has visual indicia in registration geometrically with said visual indicia of said visual stratum, said visual india of said backing stratum when observed directly being a mirror image of said visual indicia of said visual stratum when observed directly.

9. The graphic sheet of claim 3 wherein said backing stratum is permeable to an aqueous solution of a salt of a metal that is lower in the electromotive series than aluminum.

10. The graphic of claim 3 wherein said backing sheet is composed of a salt of a member of the group consisting of zinc and tin.

11. A graphic product for optical projection, said graphic product comprising a graphic sheet and at least one graphic tab for lamination to each other, each of said graphic sheet and said graphic tab comprising, as laminated strata:
    a. a support stratum composed of an optically clear polymer;
    b. an intermediate visual stratum containing a layerwise distribution of specularly reflecting highlight regions and contrasting non-specularly reflecting shadow regions;
    c. a backing stratum characterized by a surface having diffuse reflection properties.

e. said visual stratum constituting means for receiving illuminating light through said support stratum from a lamp and for differentially reflecting light through said support stratum to an optical objective; and f. a bonding stratum on said graphic tab for affixing said graphic tab to said backing stratum of said graphic sheet, said bonding stratum and said visual stratum of said graphic tab being at opposite faces of said graphic tab, said bonding stratum being optically clear.

* * * * *